United States Patent
Huang et al.

(10) Patent No.: US 10,784,252 B2
(45) Date of Patent: Sep. 22, 2020

(54) ELECTROSTATIC DISCHARGE PROTECTION CIRCUIT

(71) Applicant: Vanguard International Semiconductor Corporation, Hsinchu (TW)

(72) Inventors: Shao-Chang Huang, Hsinchu (TW); Li-Fan Chen, Hsinchu (TW); Chih-Hsuan Lin, Hsinchu (TW); Yu-Kai Wang, Hsinchu (TW); Hung-Wei Chen, Jhubei (TW); Ching-Wen Wang, Hemei Township (TW); Ting-You Lin, Hsinchu (TW); Chun-Chih Chen, New Taipei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 244 days.

(21) Appl. No.: 16/136,566

(22) Filed: Sep. 20, 2018

(65) Prior Publication Data

US 2020/0098740 A1    Mar. 26, 2020

(51) Int. Cl.
H01L 27/02    (2006.01)

(52) U.S. Cl.
CPC .................... *H01L 27/0266* (2013.01)

(58) Field of Classification Search
CPC .. H01L 27/0266; H01L 27/0255; H02H 9/046
See application file for complete search history.

(56) References Cited

U.S. PATENT DOCUMENTS 6,738,242 B1 *  5/2004  Kwong ............... H02H 9/046
                                                  361/56
7,511,932 B1 *  3/2009  Gallerano .......... H01L 27/0266
                                                  361/56

(Continued)

FOREIGN PATENT DOCUMENTS

CN    100508322 C    7/2009
CN    103646944 B    1/2017

(Continued)

OTHER PUBLICATIONS

Taiwanese Search Report and Notice of Allowance issued in TW Application No. 107123467 dated Jan. 9, 2019.

*Primary Examiner* — Fred E Finch, III
*Assistant Examiner* — Rafael O De Leon Domenech
(74) *Attorney, Agent, or Firm* — Birch, Stewart, Kolasch & Birch, LLP

(57)    ABSTRACT

An ESD protection circuit, which protects a subject NMOS transistor coupled between an I/O pad and a ground, includes a first discharge device arranged between the I/O pad and the ground, having a trigger-on voltage that is lower than a breakdown voltage of the subject NMOS transistor; and a gate voltage control device, including a discharge NMOS transistor coupled to the ground and a gate of the subject NMOS transistor; a first PMOS transistor connected to the gate of the subject NMOS transistor and a connection node; and a first NMOS transistor connected to the connection node and the ground. The connection node is connected to the gate of the discharge NMOS transistor, and the gate of the first PMOS transistor and the gate of the first NMOS transistor are connected to each other.

5 Claims, 3 Drawing Sheets

(56) References Cited

U.S. PATENT DOCUMENTS

| | | | |
|---|---|---|---|
| 7,638,847 B1 * | 12/2009 | O | H01L 27/0259 257/173 |
| 2006/0114047 A1 | 6/2006 | Irino | |
| 2006/0268473 A1 * | 11/2006 | Kemper | H01L 27/0285 361/56 |
| 2008/0055805 A1 | 3/2008 | Pong et al. | |
| 2008/0123228 A1 * | 5/2008 | Hung | H01L 27/0266 361/56 |
| 2009/0073619 A1 * | 3/2009 | Chen | H02H 9/046 361/56 |
| 2010/0002344 A1 * | 1/2010 | Huang | G11C 29/1201 361/56 |
| 2010/0208398 A1 * | 8/2010 | Jou | H02H 9/046 361/56 |
| 2013/0075854 A1 * | 3/2013 | Chang | H01L 27/0259 257/477 |
| 2013/0215541 A1 * | 8/2013 | Karp | H03K 19/00346 361/56 |
| 2018/0337170 A1 * | 11/2018 | Kanawati | H01L 23/66 |
| 2019/0173278 A1 * | 6/2019 | Jang | H02H 9/046 |

FOREIGN PATENT DOCUMENTS

| | | |
|---|---|---|
| TW | 200425459 A | 11/2004 |
| TW | 200719464 A | 5/2007 |

\* cited by examiner

ELECTROSTATIC DISCHARGE PROTECTION CIRCUIT

CROSS REFERENCE TO RELATED APPLICATIONS

Field of the Invention

The invention relates to an ESD (Electrostatic Discharge) protection circuit, especially relating to using a gate voltage control device to ground the gate of an NMOS transistor to ensure that the NMOS transistor is turned off in an ESD event.

Description of the Related Art

With the continuing evolution of semiconductor processing technology, bipolar transistors, CMOS (Complementary Metal-Oxide-Semiconductor) transistors and DMOS (Double-Diffused Metal-Oxide-Semiconductor) transistors are increasingly being integrated into one single power device. In the BCD (bipolar, CMOS and DMOS) process described above, in order to efficiently utilize the layout area of the ESD protection circuit, a PNP or NPN bipolar transistor is generally used as an ESD protection device, and a trigger-on voltage of the ESD protection circuit is lower than that of a protected device, such as the breakdown voltage of a LDNMOS (Lateral Double-Diffused NMOS) transistor.

However, the voltage at the gate of the protected device (such as the LDNMOS transistor) is affected by ESD in an ESD event, and thus it is not 0V. When there is an ESD voltage at the gate of an LDNMOS transistor, the LDNMOS transistor is turned on, causing ESD current to pass through the LDNMOS transistor and damage the LDNMOS transistor directly. Under the conditions described above, no matter how low the trigger-on voltage of the ESD protection circuit is, the turned-on LDNMOS transistor cannot be protected.

BRIEF SUMMARY OF THE INVENTION

In order to resolve the issue described above, the invention discloses an ESD protection circuit to ground the gate of a subject NMOS transistor via a gate voltage control device to ensure that the NMOS transistor is turned off in an ESD event.

In more detail, an embodiment of the invention discloses an ESD protection circuit, which protects a subject NMOS transistor coupled between an I/O pad and a ground, comprising a first discharge device arranged between the I/O pad and the ground, having a trigger-on voltage that is lower than a breakdown voltage of the subject NMOS transistor; and a gate voltage control device, comprising a discharge NMOS transistor coupled to the ground and the gate of the subject NMOS transistor; a first PMOS transistor connected to the gate of the subject NMOS transistor and a connection node; and a first NMOS transistor connected to the connection node and the ground. The connection node is connected to the gate of the discharge NMOS transistor, and the gate of the first PMOS transistor and the gate of the first NMOS transistor are connected to each other. When an ESD voltage from an ESD event is present at the gate of the subject NMOS transistor, the first PMOS transistor is turned on, and the discharge NMOS transistor is turned on by the ESD voltage to ground the gate of the subject NMOS transistor to ensure that the subject NMOS transistor is turned off.

According to the ESD protection circuit disclosed above, further comprising a trace-high circuit which includes a second PMOS transistor connected to a power terminal and a first output terminal, and a third PMOS transistor connected to the gate of the subject NMOS transistor and the first output terminal. The first output terminal is connected to the body of the first PMOS transistor; the gate of the second PMOS transistor is connected to the gate of the subject NMOS transistor; and the gate of the third PMOS transistor is connected to the power terminal.

According to the ESD protection circuit disclosed above, which further comprises a voltage clamping circuit which at least includes one resistor with a first terminal and a second terminal, the first terminal of the resister is connected to the power terminal, the second terminal of the resister coupled to the gate of the first PMOS transistor; and a capacitor with a first terminal and a second terminal, the first terminal of the capacitor directly connected to the second terminal of the resistor, and the second terminal of the capacitor connected to the ground.

According to the ESD protection circuit disclosed above, further comprising a buffer device which includes a buffer or multiple buffers which are connected in series. The input terminal of the buffer device is connected to the second terminal of the resistor, and the output terminal of the buffer device is connected to the gates of the first PMOS transistor and the first NMOS transistor. The power input terminal of each buffer of the buffer device is connected to the first output terminal of the trace-high circuit.

According to the ESD protection circuit disclosed above, further comprising a transmission gate which includes a second NMOS transistor connected to a signal terminal and a second output terminal; a fourth PMOS transistor connected to the signal terminal and the second output terminal; and an inverter with an input terminal and an output terminal. The second output terminal is connected to the gate of the subject NMOS transistor; the body of the second NMOS transistor is connected to the ground; the body of the fourth PMOS transistor is connected to the power terminal; the gate of the second NMOS transistor is connected to the input terminal of the inverter and also coupled to the gates of the first PMOS transistor and the first NMOS transistor; and the gate of the fourth PMOS transistor is connected to the output terminal of the inverter.

BRIEF DESCRIPTION OF THE DRAWINGS

The invention can be more fully understood by reading the subsequent detailed description with references made to the accompanying figures. It should be understood that the figures are not drawn to scale in accordance with standard practice in the industry. In fact, it is allowed to arbitrarily enlarge or reduce the size of devices for clear illustration.

DETAILED DESCRIPTION OF THE INVENTION

Figure 1:
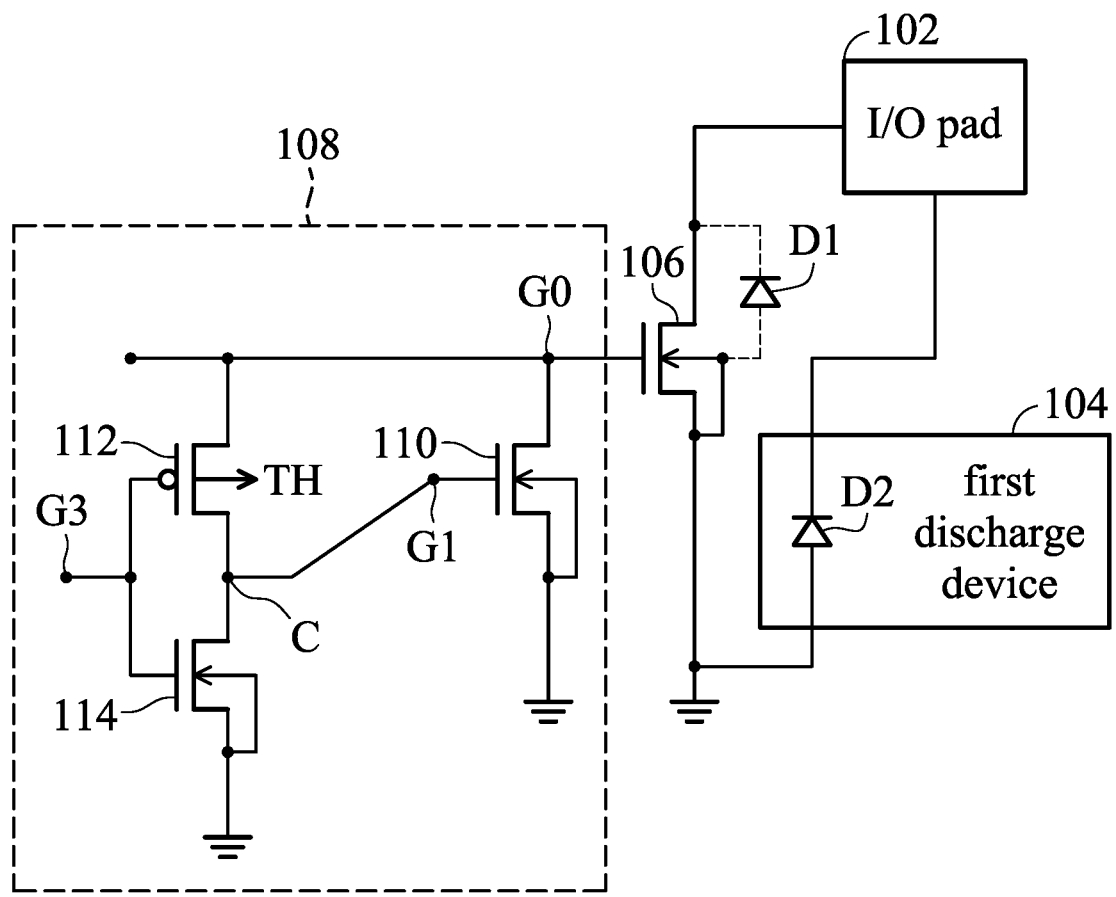
FIG. 1 shows a schematic of an ESD protection circuit in accordance with an embodiment of the disclosure.

FIG. 1 shows a schematic of an ESD protection circuit in accordance with an embodiment of the disclosure. As shown in FIG. 1, an ESD protection circuit 100 is applied to protect a subject NMOS transistor 106 coupled between an I/O pad 102 and a ground. The ESD protection circuit 100 comprises a first discharge device 104, and a gate voltage control device 108. The gate voltage control device 108 comprises a discharge NMOS transistor 110, a first PMOS transistor 112, and a first NMOS transistor 114. Diode D1 is a parasitic diode between the source and the drain of the subject NMOS transistor. The first discharge device 104 arranged between the I/O pad and the ground comprises a diode D2 with a trigger-on voltage which is lower than a break down voltage of the subject NMOS transistor 106. In an ESD event, static electricity (or ESD) enters the ESD protection circuit 100 through the I/O pad. If the subject NMOS transistor 106 is completely turned off, the ESD passes through the first discharge device 104 as a discharge path, thus an ESD current cannot pass through the subject NMOS transistor 106. Therefore, the present invention disclosed herein uses the gate voltage control device 108 to ensure that the subject NMOS transistor 106 is turned off in an ESD event.

In the gate voltage control device 108, the discharge NMOS transistor 110 is connected to the ground and the gate (marked as G0) of the subject NMOS transistor 106. The first PMOS transistor 112 is connected to the gate G0 of the subject NMOS transistor 106 and a connection node C, and the first NMOS transistor 114 is connected to the connection node C and the ground. The connection node C is connected to the gate (marked as G1) of the discharge NMOS transistor 110, and the gates (marked as G3) of the first PMOS transistor 112 and that of the first NMOS transistor 114 are connected to each other. When an ESD event happens and the gate (G0) of the subject NMOS transistor 106 is coupled with an ESD voltage, the first PMOS transistor 112 is turned on, the first NMOS transistor 114 is turned off, and the ESD voltage coupled on the gate (G0) of the subject NMOS transistor 106 will pass through the first PMOS transistor 112 and is conducted to the connection node C, so that the gate (G1) voltage of the discharge NMOS transistor 110 becomes high voltage level, and then the discharge NMOS transistor 110 is turned on and thus grounds the gate (G0) of the subject NMOS transistor 106 to ensure that the subject NMOS transistor 106 is turned off to avoid an ESD current passing through the subject NMOS transistor 106.

Figure 2:
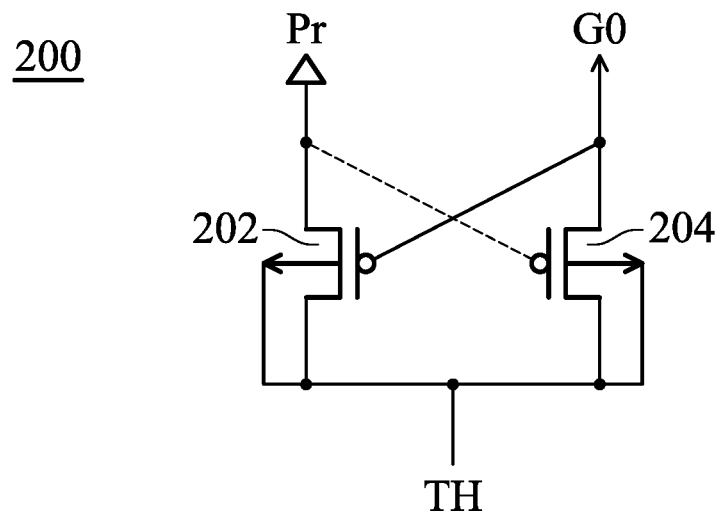
FIG. 2 shows a schematic of a trace-high circuit of the ESD protection circuit in accordance with the embodiment of the disclosure.

FIG. 2 shows a schematic of a trace-high circuit of the ESD protection circuit in accordance with the embodiment of the disclosure. The ESD protection circuit 100 in the embodiment of the disclosure further comprises a trace-high circuit as shown in FIG. 2. The trace-high circuit 200 comprises a second PMOS transistor 202 and a third PMOS transistor 204. The second PMOS transistor 202 is connected to a power terminal Pr and a first output terminal TH, and the third PMOS transistor 204 is connected to the gate (G0) of the subject NMOS transistor 106 and the first output terminal TH. The first output terminal TH is connected to the body of the first PMOS transistor 112, the gate of the second PMOS transistor 202 is connected to the gate (G0) of the subject NMOS transistor 106, and the gate of the third PMOS transistor 204 is connected to the power terminal Pr.

In an ESD event, if an ESD voltage coupled to the power terminal Pr is higher than that coupled on the gate (G0) of the subject NMOS transistor 106, then the second PMOS transistor 202 of the trace-high circuit 200 is turned on to conduct the ESD voltage on the power terminal Pr to the first output terminal TH. If the ESD voltage coupled on the power terminal Pr is lower than that coupled to the gate (G0) of the subject NMOS transistor 106, then the third PMOS transistor 204 of the trace-high circuit 200 is turned on to conduct the ESD voltage on the gate (G0) of the subject NMOS transistor 106 to the first output terminal TH. By coupling the first output terminal TH to the body of the first PMOS transistor, the first PMOS transistor 112 can avoid suffering a body effect.

Figure 3:
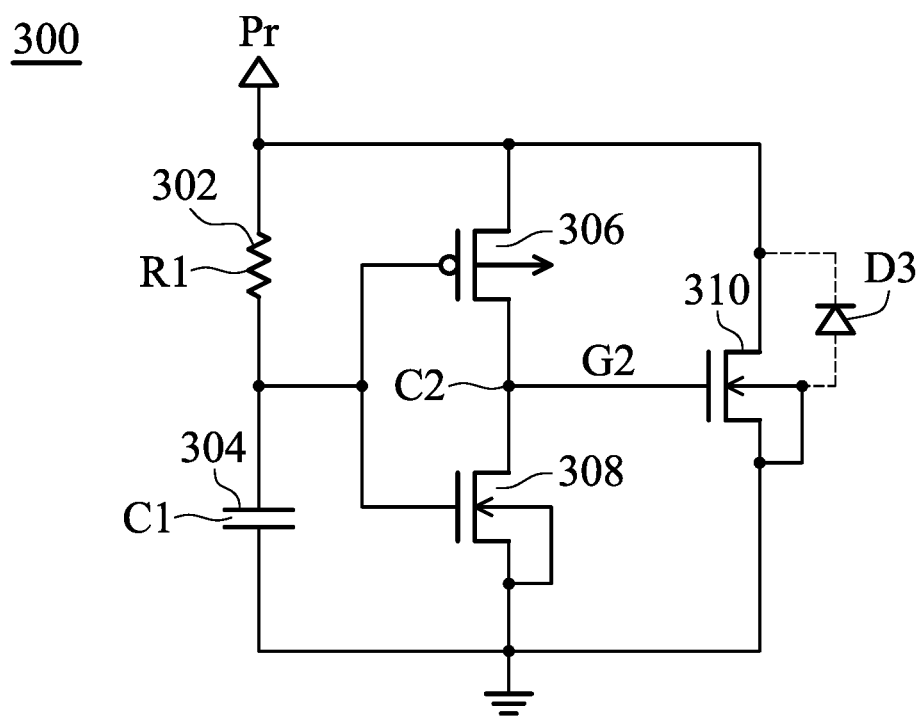
FIG. 3 shows a schematic of a voltage clamping circuit of the ESD protection circuit in accordance with the embodiment of the disclosure.

FIG. 3 shows a schematic of a voltage clamping circuit of the ESD protection circuit in accordance with the embodiment of the disclosure. As shown in FIG. 3, the ESD protection circuit 100 in the embodiment of the disclosure further comprises a voltage clamping device 300 which includes a resistor 302 (R1), a capacitor 304 (C1), a fifth PMOS transistor 306, a third NMOS transistor 308, and a fourth NMOS transistor 310. The resister 302 has a first terminal and a second terminal, its first terminal is connected to the power terminal Pr, and its second terminal is connected to the gates (G3) of the first PMOS transistor 112 and the first NMOS transistor 114. The capacitor 304 has a first terminal and a second terminal, its first terminal is directly connected to the second terminal of the resistor 302, and its second terminal is connected to the ground. The fifth PMOS transistor 306 is connected to the power terminal Pr and a second connection node C2, the third NMOS transistor 308 is connected to the second connection node C2 and the ground, and the fourth NMOS transistor 310 is connected to the ground and the power terminal Pr. The diode D3 is a parasitic diode between the source and the drain of the fourth NMOS transistor 310. During normal operation, where the power terminal Pr is powered (to supply voltage), a voltage at the second terminal of the resistor 302 is high level, thus the fifth PMOS transistor 306 is turned off, the third NMOS transistor 308 is turned on, and a voltage at a node G2 is low level, so that the fourth NMOS transistor 310 is turned off. Therefore, under normal operation, the voltage clamping device 300 does not affect the normal operation. But in an ESD event (such as the ESD appearing on the power terminal Pr), since a voltage across the capacitor 304 does not change instantaneously, the second terminal of the resistor 302 can maintain at 0V, the fifth PMOS transistor 306 is turned on, an ESD voltage coupled to the power terminal Pr is conducted to the node G2, the voltage at the node G2 becomes high level, and the fourth NMOS transistor 310 is turned on, so that an ESD current is conducted to the ground. In addition, in the ESD event, a voltage at the gate (G3) can become 0V by connecting the second terminal of the resistor 302 to the gate (G3) of the first PMOS transistor 112, so that the first PMOS transistor 112 and the discharge NMOS transistor 110 in FIG. 1 are turned on, and the gate (G0) of the subject NMOS transistor 106 is connected to the ground.

Figure 4:
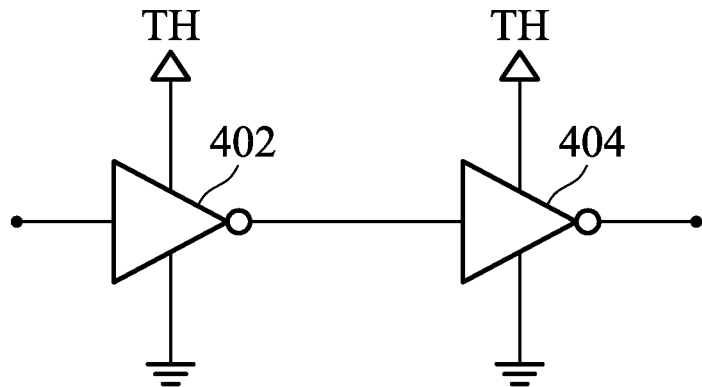
FIG. 4 shows a schematic of a buffer device of the ESD protection circuit in accordance with the embodiment of the disclosure.

FIG. 4 shows a schematic of a buffer device of the ESD protection circuit in accordance with the embodiment of the disclosure. The ESD protection circuit 100 in the embodiment of the disclosure further comprises a buffer device 400 which includes a buffer or multiple buffers which are connected in series. For example, as shown in FIG. 4, the buffer device 400 comprises a buffer which includes 2 inverters (402, 404) connected in series, but the present invention is not limited herein. The input terminal of the buffer device 400 is connected to the second terminal of the resistor 302 of the voltage clamping device 300 in FIG. 3, and the output terminal of the buffer device 400 is connected to the gate (G3) of the first PMOS transistor 112 and the first NMOS transistor 114 in FIG. 1. Power input terminals of the buffer device 400 (that is, the power input terminals of the inverter 402 and 404) is coupled to the first output terminal TH of the trace-high circuit 200 in FIG. 2. In an ESD event, an output voltage of the first output terminal TH of the trace-high circuit 200 is supplied to the buffer device 400 for operation. The buffer device 400 can improve a rising or falling edge of an ESD voltage which is coupled to the gate (G3) of the first PMOS transistor 112, so that the gate voltage control device 108 can more sensitively control the gate (G0) of the subject NMOS transistor 106 for connecting to the ground end.

Figure 5:
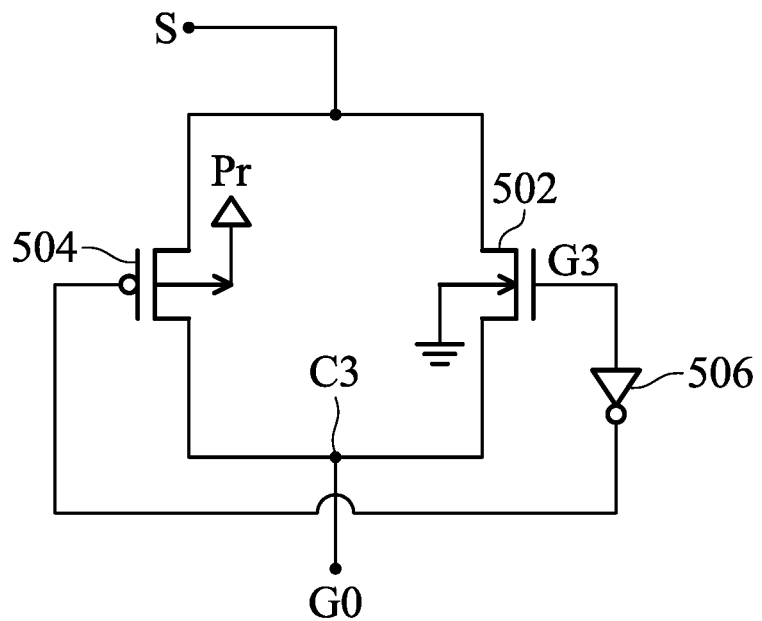
FIG. 5 shows a schematic of a transmission gate of the ESD protection circuit in accordance with the embodiment of the disclosure.

FIG. 5 shows a schematic of a transmission gate of the ESD protection circuit in accordance with the embodiment of the disclosure. As shown in FIG. 5, the ESD protection circuit 100 in the embodiment of the disclosure further comprises a transmission gate 500 which includes a second NMOS transistor 502 connected to a signal terminal (S) and a third output terminal C3, a fourth PMOS transistor 504 connected to the signal terminal (S) and the third output terminal C3, and an inverter 506 with a input terminal and a output terminal. The third output terminal C3 is connected to the gate (G0) of the subject NMOS transistor 106 in FIG. 1, the body of the fourth PMOS transistor 504 is connected to the power terminal Pr, the gate of the second NMOS transistor 502 is connected to the input terminal of the inverter 506 and the gate (G3) of the first PMOS transistor 112 and the first NMOS transistor 114. In addition, a gate the fourth PMOS transistor 504 is connected to the output terminal of the inverter 506. The transmission gate 500 decides to cut off a connection between the signal terminal (S) and the gate (G0) of the subject NMOS transistor 106 or not in accordance with the voltage level at the gates (G3) of the first PMOS transistor 112 and the first NMOS transistor 114. For example, during normal operation, the voltage at the gate (G3) is high level, thus the second NMOS transistor 502 is turned on, the voltage passing through the inverter 506 becomes low level, and thus the fourth PMOS transistor 504 is turned on, so that the signal terminal (S) is connected to the gate (G0) of the subject NMOS transistor 106, thus the transmission gate 500 does not affect the normal operation. In an ESD event, the voltage at the gate (G3) is low level, thus the second NMOS transistor 502 is turned off, the voltage passing through the inverter 506 becomes high level, and the fourth PMOS transistor 504 is turned off, so that the signal terminal (S) is not connected to the gate (G0) of the subject NMOS transistor 106, thus the signal terminal (S) can be protected from an ESD voltage coupled on the gate (G0) of the subject NMOS transistor 106.

The ordinal in the specification and the claims of the present invention, such as "first", "second", "third", etc., has no sequential relationship, and is just for distinguishing between two different devices with the same name. In the specification of the present invention, the word "couple" refers to any kind of direct or indirect electronic connection. The present invention is disclosed in the preferred embodiments as described above, however, the breadth and scope of the present invention should not be limited by any of the embodiments described above. Persons skilled in the art can make small changes and retouches without departing from the spirit and scope of the invention. The scope of the invention should be defined in accordance with the following claims and their equivalents.

What is claimed is:

1. An electrostatic discharge (ESD) protection circuit, which protects a subject NMOS transistor coupled between an I/O pad and a ground, comprising:
   a first discharge device arranged between the I/O pad and the ground, having a trigger-on voltage that is lower than a breakdown voltage of the subject NMOS transistor; and
   a gate voltage control device, comprising:
      a discharge NMOS transistor coupled to the ground and a gate of the subject NMOS transistor;
      a first PMOS transistor connected to the gate of the subject NMOS transistor and a connection node; and
      a first NMOS transistor connected to the connection node and the ground;
   wherein the connection node is connected to a gate of the discharge NMOS transistor, and a gate of the first PMOS transistor and a gate of the first NMOS transistor are connected to each other;
   when an ESD voltage from an ESD event is present at the gate of the subject NMOS transistor, the first PMOS transistor is turned on, and the discharge NMOS transistor is turned on by the ESD voltage to ground the gate of the subject NMOS transistor to ensure that the subject NMOS transistor is turned off.

2. The ESD protection circuit as claimed in claim 1, further comprising a trace-high circuit which includes:
   a second PMOS transistor connected to a power terminal and a first output terminal; and
   a third PMOS transistor connected to the gate of the subject NMOS transistor and the first output terminal;
   wherein the first output terminal is connected to a body of the first PMOS transistor; a gate of the second PMOS transistor is connected to the gate of the subject NMOS transistor; and a gate of the third PMOS transistor is connected to the power terminal.

3. The ESD protection circuit as claimed in claim 2, further comprising a voltage clamping circuit which at least includes:
   a resistor with a first terminal and a second terminal, wherein the first terminal of the resister is connected to the power terminal and the second terminal of the resister is connected to the gate of the first PMOS transistor; and
   a capacitor with a first terminal and a second terminal, wherein the first terminal of the capacitor is directly connected to the second terminal of the resistor, and the second terminal of the capacitor is connected to the ground.

4. The ESD protection circuit as claimed in claim 3, further comprising a buffer device which includes a buffer or multiple buffers which are connected in series;
   wherein an input terminal of the buffer device is connected to the second terminal of the resistor, an output terminal of the buffer device is connected to the gates of the first PMOS transistor and the first NMOS transistor;
   wherein a power input terminal of each buffer of the buffer device is connected to the first output terminal of the trace-high circuit.

5. The ESD protection circuit as claimed in claim 4, further comprising a transmission gate which includes:
   a second NMOS transistor connected to a signal terminal and a second output terminal;
   a fourth PMOS transistor connected to the signal terminal and the second output terminal; and
   an inverter with an input terminal and an output terminal;

wherein the second output terminal is connected to the gate of the subject NMOS transistor; a body of the second NMOS transistor is connected to the ground; a body of the fourth PMOS transistor is connected to the power terminal; a gate of the second NMOS transistor is connected to the input terminal of the inverter and also connected to the gates of the first PMOS transistor and the first NMOS transistor; and a gate of the fourth PMOS transistor is connected to the output terminal of the inverter.

* * * * *